Jan. 26, 1965 L. O. HUBBARD 3,167,715

FM AUTOMATIC FREQUENCY CONTROL CIRCUIT USING MIXER TUBE

Filed June 26, 1961

INVENTOR.

LINUS O. HUBBARD

BY

Mason, Kolehmainen, Rathburn and Wyss

ATTORNEYS

United States Patent Office 3,167,715 Patented Jan. 26, 1965

3,167,715

FM AUTOMATIC FREQUENCY CONTROL CIRCUIT USING MIXER TUBE

Linus O. Hubbard, Chicago, Ill., assignor to Wells-Gardner Electronics Corporation, Chicago, Ill., a corporation of Illinois Filed June 26, 1961, Ser. No. 119,679
9 Claims. (Cl. 325—420)

Figures 1, 2:
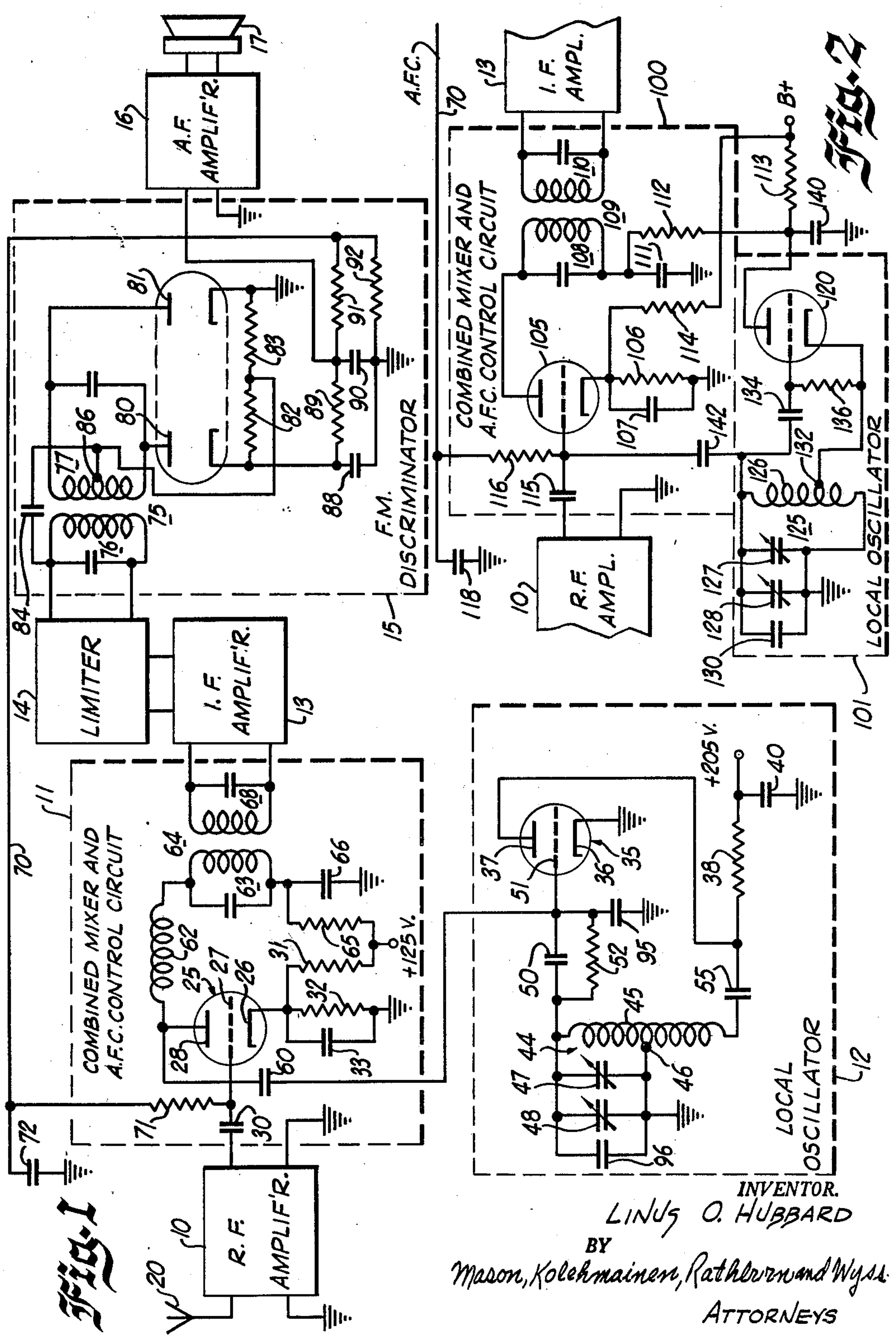

The present invention relates to an automatic frequency control circuit, and, more particularly, to an automatic frequency control circuit of the type employed in an FM receiver to provide automatic frequency correction of the local oscillator portion of the receiver so that the receiver remains satisfactorily tuned to a received FM station.

In the field of automatic frequency control numerous circuits have been proposed whereby the frequency of the local oscillator in an FM receiver can be automatically controlled so that the receiver remains tuned to a particular station despite variation in supply voltages, ambient temperature, and other variable factors. In general, these prior automatic frequency control circuit arrangements have required the use of an additional tube or semiconductor device for automatic frequency control purposes which necessarily increases the cost and complexity of the automatic frequency control circuit and likewise affects the overall cost of the FM receiver. In addition, certain other prior art arrangements have proposed the use of a pentagrid converter type of mixer-oscillator circuit wherein the pentagrid converter tube was called upon to control the frequency of the locally generated oscillations. However, such pentagrid converter type circuits were employed only at relatively low frequencies in the broadcast and short wave bands and introduced entirely too much frequency variation to be employed as a stable automatic frequency control circuit in the frequency range of 100 megacycles which is required for present day FM reception.

It is, therefore, an object of the present invention to provide a new and improved automatic frequency control circuit wherein one or more of the disadvantages of the above described prior art arrangement are eliminated.

It is another object of the present invention to provide a new and improved automatic frequency control circuit which is capable of providing the amount of frequency control required for local oscillator correction in a high frequency receiver without requiring the use of an auxiliary control tube for automatic frequency control purposes.

It is a further object of the present invention to provide a new and improved automatic frequency control circuit suitable for use in reception of FM frequencies wherein separate triode mixer and oscillator tubes are employed and the triode mixer tube also acts as an automatic frequency control tube to provide the required amount of frequency correction for the local oscillator tube.

It is a still further object of the present invention to provide a new and improved automatic frequency control circuit suitable for use in an FM receiver wherein separate triode mixer and oscillator tubes are employed and the mixer tube acts as a variable resistive load on the oscillator tank circuit so that automatic frequency correction is provided at FM frequencies without the use of an auxiliary control tube.

Briefly, in accordance with one aspect of the invention, separate triode mixer and oscillator tubes are employed and the oscillator tank circuit is coupled to the mixer tube in such manner that the mixer tube can act as a variable resistive load on the oscillator tank circuit while, at the same time, providing a circuit coupling arrangement suitable for applying the locally generated oscillations to the signal grid of the mixer tube for signal mixing or heterodyning purposes. An automatic frequency correction voltage, which is derived from the discriminator portion of the FM receiver, is applied to the control grid of the mixer tube so as to cause the plate resistance of this tube to vary in accordance with deviations of the frequency of the local oscillator from a predetermined value. Due to the variable loading effect of the mixer tube on the oscillator tank circuit, the frequency of oscillations is varied in the proper direction to correct the local oscillator frequency over a substantial "pull-in" range. In accordance with another aspect of the invention, the local oscillator tank circuit is coupled directly to the signal grid of the mixer tube, and the plate circuits of the mixer tube and the oscillator tube are interconnected in such manner that the B+ voltage applied to the local oscillator tube is varied in accordance with the flow of plate current through the mixer tube. In this embodiment an AFC voltage is applied to the control grid of the mixer tube so that the local oscillator frequency is controlled both by the variation in input capacity of the mixer tube and by the variation in plate current in this tube which is employed to control the B+ voltage which is applied to the plate of the local oscillator tube.

The invention, both as to its organization and method of operation, together with further objects and advantages thereof, will best be understood by reference to the following specification taken in connection with the accompanying drawing, in which:

FIG. 1 is a schematic diagram, partly in block diagram form, of an FM receiver embodying the automatic frequency control circuit of the present invention; and FIG. 2 is a schematic diagram of an alternative automatic frequency control circuit of the present invention.

Referring now to the drawings, and more particularly, to FIG. 1 thereof, the present invention is therein illustrated as incorporated in an FM receiver which comprises an RF amplifier indicated generally at 10, a mixer circuit indicated generally at 11, which is also employed for automatic frequency control purposes as will be described in more detail hereinafter, a local oscillator 12, an IF amplifier 13, a limiter 14, a discriminator 15, an audio frequency amplifier 16 and a loudspeaker 17. The stages or units 10, 13, 14, 15, 16 and 17 may all be of conventional, well-known construction so that a detailed description thereof is deemed unnecessary herein.

Referring briefly, however, to the general mode of operation of the FM receiver shown in FIG. 1, signals which are received by the FM antenna system 20 are coupled to the RF amplifier 10 wherein the signal corresponding to a particular selected FM station is selectively amplified and coupled to the mixer circuit 11 so that the RF signal is heterodyned with a suitable local oscillator signal generated in the local oscillator circuit 12. As a result, an intermediate frequency signal is produced in the output circuit of the mixer 11 and this intermediate frequency signal is applied to the intermediate frequency amplifier 13 wherein it is amplified to a suitable level for application to the limiter 14. In the limiter 14 the amplitude variations of the amplified intermediate signal are removed and the resultant intermediate frequency signal is applied to the FM discriminator 15 which functions to produce an audio frequency output signal corresponding to the frequency modulation components of the received FM signal. This audio frequency signal is applied to the audio frequency amplifier 16 for further amplification and is then applied to the loudspeaker 17 for sound reproduction purposes.

Referring now to the portion of the FM receiver of FIG. 1 which embodies the present invention, the combined mixer and AFC control circuit 11 comprises a triode tube 25 having a cathode 26, a signal grid 27 and a plate 28. The frequency modulated carrier signal which is amplified in the amplifier 10 is applied to the signal grid of the mixer tube 25 through a coupling condenser 30 and the cathode 26 of this tube is provided with positive bias by means of the voltage divider comprising the series resistors 31 and 32 which are connected between the B+ terminal and ground, a bypass condenser 33 being connected across the lower resistor 32 to effectively ground the cathode 26 for signal frequencies.

The local oscillator stage 12 comprises a triode local oscillator tube 35, the cathode 36 of which is connected to ground and the anode 37 of which is connected through a resistor 38 to the B+ supply, a filtering condenser 40 being connected from the B+ terminal to ground to filter out any hum components or other undesired signal components present on the power supply conductor, as will be readily apparent to those skilled in the art. An oscillator tank circuit comprising an inductance 45, having a tap 46, and a pair of variable capacitors 47 and 48 which are connected between one end of the inductance 45 and its tap 46, is coupled to the oscillator tube 35 in such manner as to provide sustained oscillations in this tank circuit. More particularly, the tap 46 is connected to ground and the upper end of the coil 45 is coupled through a condenser 50 to the control grid 51 of the oscillator tube 35. A grid leak resistor 52 is connected across the condenser 50 so as to provide a D.C. path from the control grid 51 to ground. The other end of the coil 45 is coupled through a capacitor 55 to the plate 37 of the oscillator tube 35. Conventionally, the capacitor 47 is ganged with a variable capacitor in the RF amplifier 10 so as to permit tuning to different FM stations as will be readily understood by those skilled in the art. The capacitor 48 may comprise a suitable trimming or padding condenser for oscillator tracking purposes.

It will thus be seen that a Hartley type of oscillator circuit is provided as the circuit 12 wherein the D.C. voltage for the oscillator tube 35 is introduced by means of a shunt feed system including the resistor 38. Since the oscillator circuit 12 is provided with grid leak bias, this circuit is self-starting and oscillations will be developed in the tank circuit 44 while, at the same time, the control grid 51 of the tube 35 is biased negatively by means of the voltage developed across the condenser 50 until a point of oscillator stability is reached, as will be readily understood by those skilled in the art.

In accordance with an important feature of the present invention, the local oscillations developed in the tank circuit 44 are coupled to the signal grid of the mixer tube 25 in such manner that this mixer tube may also operate as a variable resistance for automatic frequency control purposes. More particularly, the control grid 51 of the oscillator tube 35 is coupled through a small condenser 60 to the plate 28 of the mixer tube 25 so that the locally generated oscillations in the circuit 12 are applied to the plate of the mixer tube 25 instead of the conventional connection of the locally generated oscillations to the signal grid 27. Since the locally generated oscillations are applied to the plate of the mixer tube 25, there must be provided in the plate circuit of this tube a plate load impedance of substantial value at the local oscillator frequency, otherwise the plate 28 could not swing back and forth and the local oscillations would be short circuited to ground. To this end, a small choke coil 62 is provided between the plate 28 of the mixer tube 25 and the primary circuit 63 of the IF coupling transformer 64 which is tuned to the desired intermediate frequency. Since the local oscillator frequency is in the neighborhood of 100 megacycles whereas the intermediate frequency is normally at a frequency of 10.7 megacycles, the choke coil 62 is arranged to have a substantial inductive reactance at a frequency of 100 megacycles. However, the choke coil 62 will have only a small inductive reactance at the intermediate frequency of 10.7 megacycles so that a relatively small amount of the intermediate frequency signal is lost across the choke coil 62. In this connection it will be understood that a suitable energizing voltage is applied through a B+ dropping resistor 65 which is connected between the B+ terminal and one end of the primary circuit 63, a suitable bypassing condenser 66 being connected from the junction point of the resistor 65 to the primary circuit 63 to ground.

With the choke coil 62 included in the plate circuit of the mixer tube 25, this plate circuit has a substantial impedance at the local oscillator frequency and hence a voltage from the local oscillator will appear on the plate 28 of the tube 25. This voltage is coupled through the internal grid-to-plate capacitance of the tube 25 to the signal grid 27 of this tube so that a heterodyning or mixing action can take place between the RF signal impressed upon the grid 27 from the amplifier 10 and the local oscillator voltage coupled over the above described path to the grid 27. As a result of this heterodying action a beat frequency or intermediate frequency signal is produced equal to the difference between the RF signal frequency and the local oscillator frequency and this intermediate frequency signal is developed across the primary circuit 63 which is tuned to this intermediate frequency. The intermediate frequency developed in the primary circuit 63 is coupled to the tuned secondary circuit 68 of the IF transformer 64 and is then applied to the input of the IF amplifier 13 for further amplification. As stated heretofore, the choke coil 62 has a relatively small impedance at the intermediate frequency and hence the major portion of the intermediate frequency signal developed at the plate of the tube 25 appears across the primary circuit 63 and is applied to the IF amplifier 13.

It will be noted in the arrangement described thus far that the coupling capacitor 60 is connected in series with the mixer tube 25 to A.C. ground and this series combination is effectively connected across the oscillator tank circuit 44 through the oscillator grid condenser 50. In accordance with a further important aspect of the present invention, the plate resistance of the mixer tube 25 is varied in accordance with an automatic frequency control voltage derived from the discriminator 15 and this variation in plate resistance is employed to exercise a controlling effect directly on the local oscillator 12 so that a separate automatic frequency control tube is not required. More particularly, an AFC control voltage which is derived from the discriminator 15 and is produced on the conductor 70 is coupled through a resistor 71 to the signal grid 27 of the mixer tube 25, this control voltage varying with changes in the frequency of the intermediate frequency carrier applied to the discriminator 15. It will be understood that any difference between the intermediate frequency carrier and the discriminator center frequency may be due to a change in the local oscillator frequency or mistuning of the receiver. A bypass capacitor 72 is connected between the conductor 70 and ground so as to remove any audio frequency components or 60 cycle hum components on this conductor so that these undesired components will not be permitted to affect the frequency of the local oscillator 12.

The AFC control voltage on the conductor 70 may be developed in the FM discriminator 15 in any suitable manner, one such arrangement being shown in FIG. 1 of applicant's drawings. More particularly, the amplitude limited intermediate frequency signal from the limiter 14 is applied to a double tuned transformer circuit 75, the primary circuit 76 and the secondary circuit 77 which are both tuned to the intermediate frequency. At resonance the primary and secondary voltages developed across the primary and secondary circuits 76 and 77 are 90° out of phase and these voltages are combined in the conventional manner to provide a conventional discriminator output signal. Thus, the anodes of two diode rectifiers 80 and 81 are connected to the opposite ends of the secondary circuit 77 and a pair of resistors 82 and 83 are connected between the cathodes of these diodes. The primary voltage is additively combined with the secondary voltage by means of a condenser 84 which is connected from one side of the primary circuit 76 to a center tap 86 of the secondary circuit 77, this center tap 86 being also connected directly to the junction point of the resistors 82 and 83. The outputs of the two rectifiers 80 and 81 are differentially combined and if the IF signal from the limiter 14 exactly corresponds to the center intermediate frequency of 10.7 megacycles, the voltages developed across the resistors 82 and 83 are of equal amplitudes and of opposite polarities so that no output is produced across the condenser 88 which is connected across these resistors. However, as the frequency of the intermediate frequency signal is varied in accordance with the frequency modulation component of the received signal the phase shift between primary and secondary voltages in the transformer 75 varies correspondingly so that an output signal proportional in amplitude to this frequency shift is produced across the condenser 88. This output signal is coupled through a filter comprising the series resistor 89 and the shunt condenser 90 to the input of the audio frequency amplifier 16 wherein the audio signal is amplified for sound reproduction purposes. In order to provide a control voltage of the correct voltage level for application to the grid of the mixer tube 25, a voltage divider comprising the resistors 91 and 92 is connected across the condenser 90 and the value of the resistors 91 and 92 is so chosen that the potential on the conductor 70 which is connected to the junction of these resistors is of the correct value for biasing the signal grid 27 and the mixer tube 25. In this connection, it will be understood that any other type of frequency discriminator, such, for example, as the well-known ratio detector may equally well be employed to derive the control voltage on the conductor 70.

Considering now the operation of the circuit 11 in exercising a controlling effect on the frequency of the local oscillator 12, it should first be noted that the coupling capacitor 60 is quite small to provide the correct amount of oscillator injection. However, the capacitive reactance of the capacitor 60 at the local oscillator frequency is very much less than the plate resistance of the mixer tube 25. Accordingly, the series combination of the capacitor 60 and the plate resistance of the tube 25 is predominantly resistive so that an essentially resistive loading effect is produced on the tank circuit 44 which varies in accordance with the value of the plate resistance of the mixer tube 25. As the plate resistance of the tube 25 varies, this resistive loading effect also varies so that the amplitude of oscillations produced in the circuit 44 varies in a corresponding manner. When the amplitude of oscillations produced in the tank circuit 44 is varied the bias voltage developed across the capacitor 50 likewise varies, since this bias voltage depends upon how hard the signal grid 51 of the oscillator tube 35 is driven, and as the bias voltage on the grid 51 is varied the input capacitance of the oscillator tube 35 also varies. Such a change in input capacitance of the oscillator tube 35 with variation in signal grid bias is due to several factors including space charge effects, transit time and the well-known Miller effect, as will be readily understood by those skilled in the art. Since the input capacitance of the oscillator tube 35 is connected in series with the condenser 50 to the oscillator tank circuit 44, a change in the input capacity of the oscillator tube 35 produces a corresponding change in the resonant frequency of the tank circuit 44. While this change in frequency is relatively small, it is, nevertheless, sufficient to provide a range of frequency control adequate for operation at FM frequencies. In this connection it will be understood that whereas for FM reception the oscillator frequency is in the neighborhood of 100 megacycles, only a total frequency correction of approximately 500 kilocycles is required so that a total frequency correction range of only 0.5% is required. This amount of frequency correction is provided by variation in the automatic frequency control voltage produced on the conductor 70 which varies the signal bias applied to the signal grid 27 of the mixer tube 25. As the bias on the signal grid 27 is varied the plate resistance of the mixer tube 25 varies in a corresponding manner and this variation in plate resistance of the tube 25 is effective to provide the above described change in frequency of the local oscillator tank circuit 44. Thus, assuming that the frequency of the local oscillator 12 increases slightly, due to ambient temperature variations or some other undesired factor, the voltage appearing on the conductor 70 will increase positively due to the fact that the frequency of the intermediate frequency carrier is now slightly higher than the resonant frequency of the discriminator circuits 76 and 77. When the voltage on the conductor 70 increases positively, the mixer tube 25 draws a larger D.C. current so that its plate resistance is decreased and a larger resistive load is presented to the oscillator tank circuit 44. This increased load on the tank circuit 44 causes the amplitude of oscillations produced across this tank circuit to be reduced and as a result the bias voltage developed across the capacitor 50 is correspondingly reduced since the signal grid of the oscillator tube 35 is not now driven as hard. When the bias on the signal grid 51 of the oscillator tube 35 is thus reduced the input capacitance between the signal grid 51 and the cathode 36 of the oscillator tube 35 is increased. Since the output capacitance of the oscillator tube 35 forms a part of the oscillator tank circuit 44 the total capacitance of this tank circuit is thus increased so that its resonant frequency is reduced and the desired reduction in frequency of the local oscillator 12 is thereby achieved.

While the automatic frequency control circuit of the present invention is effective to provide a frequency controlling effect over a range of approximately 500 kilocycles, it will be understood that some sort of coarse temperature compensation of the local oscillator 12 is required so that the frequency of this local oscillator does not drift by a large amount during warmup periods and the like. To this end a temperature compensating capacitor 95 may be connected between the grid 51 of the oscillator tube 35 and ground and another temperature compensating capacitor 96 may be connected directly across the gang condenser 47, the condensers 95 and 96 having suitable negative temperature coefficients so that a coarse temperature compensation is provided by these capacitors. The automatic frequency controlling effect exercised by the mixer tube 25 in the manner described above, then provides automatic frequency correction for minor variations in the local oscillator frequency due to temperature effects and also provides correction for incorrect tuning of the receiver to the received FM signal.

Since the mixer tube 25 is employed for automatic frequency correction of the local oscillator 12, it is important that the plate resistance of this tube does not vary in accordance with any 60 cycle hum components or audio frequency components. Accordingly, the capacitor 72 which bypasses the AFC conductor 70 to ground has a large value so as to prevent such low frequency components from appearing at the signal grid of the mixer tube 25. It is also pointed out that the resistor 91 has a high enough resistance so that there is substantially no loading effect reflected back to the discriminator circuit 15 so that the discriminator output characteristic is not distorted as would be the case if the discriminator circuit were made to control the local oscillator directly.

In FIG. 2 of the drawings there is shown an alternative embodiment of the present invention wherein automatic frequency control of the local oscillator is effected in a somewhat different manner than that described heretofore in connection with FIG. 1. Referring to FIG. 2, the combined mixer and AFC control circuit is indicated by the block 100 and the local oscillator is indicated by the block 101, only the RF amplifier 10 and IF amplifier 13 of the remaining portions of the receiver being shown in this figure of the drawings. In the circuit 100 a triode mixer tube 105 is employed, the cathode of this tube being connected to ground through the cathode bias resistor 106 and the bypass condenser 107. The plate of the mixer tube 105 is coupled through the primary circuit 108 of an IF transformer 109, the secondary circuit 110 of this transformer being coupled to the IF amplifier 13. From the primary transformer circuit 108, the plate circuit of the mixer tube 105 is connected through a first plate dropping resistor 112 and then through another resistor 113 to the B+ supply terminal. The IF primary circuit is bypassed by capacitor 111. The cathode of tube 105 is also connected through bleeder resistor 114 to B+. The RF signal from the amplifier 10 is coupled through the condenser 115 to the control grid of the mixer tube 105 and an AFC control voltage appearing on the conductor 70, which is derived from the discriminator portion of the receiver in a manner identical to that described in connection with FIG. 1, is applied to this grid through a resistor 116, the conductor 70 being bypassed to ground by means of a capacitor 118.

In the local oscillator circuit 101, a triode oscillator tube 120 is provided, the plate of this tube being connected through the resistor 113 to the B+ supply so that the resistor 113 forms a common plate load impedance for both the mixer tube 105 and the oscillator tube 120. The oscillatory tank circuit 125 for the oscillator 101 comprises a tapped coil 126, the gang condenser 127, the trimmer condenser 128 and the temperature compensation capacitor 130. The cathode of the oscillator tube 120 is connected to a tap 132 on the coil 126 and the upper end of this coil is connected to the control grid of the oscillator tube through the capacitor 134, a grid leak resistor 136 being provided between grid and cathode of the oscillator tube 120. Since the plate circuit of the oscillator tube 120 is not employed for feedback in the oscillator circuit 101, a bypass condenser 140 is connected between the plate of this tube to ground. The oscillations developed across the tank circuit 125 are coupled to the signal grid of the mixer tube 105 through a small coupling capacitor 142. In this connection it should be noted that whereas Hartly oscillator circuits have been illustrated in FIGS. 1 and 2, any suitable form of self-biased oscillator circuit may be employed in which a substantial portion of the oscillator tank circuit is connected between grid and cathode of the oscillator tube. This requirement is due to the fact that variations in the grid to cathode capacity of the oscillator tube are employed to vary the resonant frequency of the oscillator tank circuit so that if this grid to cathode capacity were connected across only a small portion of the tank circuit not enough frequency change would be produced. It will, of course, be understood that either of the oscillator circuits 101 or 12 or, in the alternative, an oscillator of the well-known grounded grid type, may be employed in either of the system arrangements shown in FIGS. 1 and 2.

Considering now the operation of the circuit arrangement of FIG. 2, it will be seen that the D.C. current drawn by the mixer tube 105 is varied in accordance with the AFC control voltage appearing upon the conductor 70 since this voltage is applied to the control grid of the mixer tube 105. This variation in current drawn through the mixer tube 105 is arranged to control the frequency of the local oscillator 101 in two different ways. First, the bias on the mixer tube 105 is varied in accordance with the voltage on the conductor 70 the input capacity, i.e., the capacity between the signal grid and cathode of the mixer tube 105 is varied. Since this input capacity of the mixer tube 105 is connected in series with the coupling condenser 142 across the oscillator tank circuit 125, it will be evident that the resonant frequency of the oscillator tank circuit is varied in accordance with the control voltage produced on the AFC conductor 70. Furthermore, it will be noted that this input capacitance variation of the mixer tube 105 is in the correct direction to restore the local oscillator frequency to its original value.

The second way in which the tube 105 exercises an additional control on the frequency of the local oscillator 101 is by virtue of the common plate load resistor 113 which is employed for both the mixer tube 105 and the oscillator tube 120. As the current drawn by the tube 105 is varied in accordance with the automatic frequency control voltage on the conductor 70, the plate voltage applied to the oscillator tube 120 through the common load resistor 113 varies correspondingly. When the plate voltage applied to the oscillator tube 120 is thus varied the amplitude of the oscillations produced in the tank circuit 125 is varied in the correct direction to produce a change in the input capacitance of the oscillator tube 120 which provides the desired frequency correction. For example, if the AFC voltage on the conductor 70 increases, the current drawn through the mixer tube 105 will increase so that the voltage drop across the resistor 113 is increased and the voltage applied to the plate of the oscillator tube 120 will be reduced so that the strength of oscillations produced across the oscillator tank circuit 125 is also reduced. When the amplitude of oscillations in the tank circuit 125 is reduced the bias developed across the capacitor 134 is reduced with the result that the input capacitance of the oscillator tube 120 increases. With this increase in input capacitance added to the tank circuit 125 the resonant frequency of this tank circuit is decreased so that the frequency of the local oscillator 101 is corrected in the proper direction. In a similar manner, if the voltage on the AFC conductor 70 decreases, indicating that the local oscillator frequency is too low, the strength of oscillations in the tank circuit 125 will be increased so as to produce a larger bias voltage across the capacitor 134 and hence reduce the input capacitance of the tube 120 so that the resonant frequency of the tank circuit 125 increases.

While the circuit arrangement of FIG. 2 employs the mixer tube 105 to control the frequency of the local oscillator 101 by both of the above described effects, it will be understood that either effect may be utilized separately. For example, the change in input capacitance of the mixer tube 105 may be employed alone to provide automatic frequency control in which case the common plate load resistor 113 is eliminated. However, it should be noted that a wider pull-in range of frequency control is afforded by the arrangement shown in FIG. 2 wherein both of the above described frequency correction factors are utilized. Furthermore, it will be noted that the common plate load resistor arrangement of FIG. 2 may, if desired for additional range of frequency correction, be incorporated in the system of FIG. 1, in which case the resistor 113 may be connected between the resistor 38 and the B+ terminal in FIG. 1.

By way of example, and not in any sense as a limitation to the particular values given, an automatic frequency control circuit constructed in accordance with the arrangement shown in FIG. 1 of the drawings has been found to provide satisfactory frequency correction for all stations in the FM frequency band while employing a commercial type dual triode 6AQ8 as the tubes 25 and 35 and with the following circuit constants:

| | | |
|---|---|---|
| Resistor 31 | ohms | 15,000 |
| Resistor 32 | do | 220 |
| Resistor 38 | do | 27,000 |
| Resistor 52 | do | 22,000 |
| Resistor 71 | do | 15,000 |
| Resistor 91 | megohms | 1.0 |
| Resistor 92 | do | 1.0 |

| | | |
|---|---|---|
| Capacitor 30 | mfd | .001 |
| Capacitor 33 | mfd | .001 |
| Capacitor 50 | mmf | 47 |
| Capacitor 55 | mfd | .001 |
| Capacitor 60 | mmf | 2.5 |
| Capacitor 66 | mfd | .01 |
| Capacitor 72 | mfd | .1 |
| Inductance 62 | microhenries | 3.3 |

Similarly, the following circuit constants have been found satisfactory in connection with the embodiment of FIG. 2:

| | | |
|---|---|---|
| Resistor 106 | ohms | 270 |
| Resistor 112 | do | 2200 |
| Resistor 113 | do | 27,000 |
| Resistor 116 | do | 47,000 |
| Resistor 136 | do | 22,000 |
| Resistor 114 | do | 15,000 |
| Capacitor 107 | mfd | .01 |
| Capacitor 115 | mfd | .001 |
| Capacitor 118 | mfd | .1 |
| Capacitor 130 | mmf | 4 |
| Capacitor 134 | mmf | 47 |
| Capacitor 140 | mmf | 470 |
| Capacitor 142 | mmf | 2 |
| Capacitor 111 | mfd | .01 |

While certain preferred embodiments of the invention have been described by way of illustration, many modifications will occur to those skilled in the art. It will be understood, of course, that it is not desired that the invention be limited thereto since modifications may be made, and it is, therefore contemplated by the appended claims to cover any such modifications as fall within the true spirit and scope of the invention.

What is claimed as new and desired to be secured by Letters Patent of the United States is:

1. In a superheterodyne receiver, a mixer tube, means for supplying a radio frequency signal to the signal grid of said mixer tube, a local oscillator tube, means for supplying a local oscillator signal from said local oscillator tube to the signal grid of said mixer tube, means for deriving an intermediate frequency signal from the plate circuit of said mixer tube, frequency discriminating means for developing from said intermediate frequency signal a control voltage which varies with changes in the frequency of the intermediate frequency carrier, means for applying said control voltage to said mixer tube to control the plate resistance thereof, means responsive to changes in the plate resistance of said mixer tube for varying the amplitude of local oscillations produced by said local oscillator tube, and means for varying the frequency of said local oscillations in accordance with said variations in the amplitude of said local oscillations.

2. In a superheterodyne receiver, a mixer tube, means for supplying a radio frequency signal to the signal grid of said mixer tube, a local oscillator tube having a tank circuit connected thereto across which local oscillations are developed, a coupling capacitor interconnecting said tank circuit and said mixer tube so that said local oscillations are suppiled to said signal grid of said mixer tube, means for deriving an intermediate frequency signal from the plate circuit of said mixer tube, frequency discriminating means for developing from said intermediate frequency signal a control voltage which varies with changes in the frequency of the intermediate frequency carrier, means for applying said control voltage to said mixer tube to vary the plate resistance of said mixer tube which is connected in series with said coupling capacitor, means responsive to changes in the plate resistance of said mixer tube for varying the amplitude of said local oscillations, and means responsive to variations in the amplitude of said local oscillations for varying the input capacitance of said local oscillator tube, thereby to control the frequency of said local oscillations developed across said tank circuit.

3. In a superheterodyne receiver, a mixer tube, means for supplying a signal modulated wave to the signal grid of said mixer tube, a local oscillator circuit for developing a local oscillator signal, means including a coupling capacitor connected between said local oscillator circuit and the plate of said mixer tube for coupling said local oscillator signal to said signal grid of said mixer tube, means for deriving an intermediate frequency signal from the plate circuit of said mixer tube, frequency discriminating means having a predetermined center frequency, said frequency discriminating means including means for developing from said intermediate frequency signal a control voltage which varies with changes in the frequency of the intermediate frequency carrier, and means for varying the plate resistance of said mixer tube in accordance with said control voltage and in the proper direction to correct the frequency of said local oscillator signal so that the intermediate frequency carrier is shifted toward said predetermined center frequency.

4. In a superheterodyne receiver, a mixer tube, means for supplying a signal modulated wave to the signal grid of said mixer tube, a local oscillator circuit for developing a local oscillator signal, means including a coupling capacitor connected between said local oscillator circuit and the plate of said mixer tube for coupling said local oscillator signal to said signal grid of said mixer tube, means for deriving an intermediate frequency signal from the plate circuit of said mixer tube, frequency discriminating means having a predetermined center frequency, said frequency discriminating means including means for developing from said intermediate frequency signal a control voltage which varies with changes in the frequency of the intermediate frequency carrier, and means for supplying said control voltage to said signal grid of said mixer tube, thereby to produce a variation in the plate resistance of said mixer tube in accordance with said control voltage, said variation in plate resistance of said mixer tube being reflected back to said local oscillator circuit through said coupling capacitor and producing a variable loading effect thereon which is effective to vary the frequency of said local oscillator signal in such manner that the intermediate frequency carrier is shifted toward said predetermined center frequency.

5. In a superheterodyne receiver, a mixer tube, means for supplying a signal modulated wave to the signal grid of said mixer tube, a local oscillator tube, an oscillator tank circuit having one terminal thereof connected to ground, means for coupling said tank circuit to said local oscillator tube to produce a local oscillator signal across said tank circuit, a coupling capacitor connected between the grid of said local oscillator tube and the plate of said mixer tube, whereby said local oscillator signal is supplied to said signal grid of said mixer tube through said coupling capacitor and the plate to signal grid capacitance of said mixer tube, means for deriving an intermediate frequency signal from the plate circuit of said mixer tube, frequency discriminating means for developing from said intermediate frequency signal a control voltage which varies with changes in the frequency of the intermediate frequency carrier, and means for varying the plate resistance of said mixer tube in accordance with said control voltage and in the proper direction to correct the frequency of said local oscillator signal.

6. In a superheterodyne receiver, a mixer tube, means for supplying a signal modulated wave to the signal grid of said mixer tube, a local oscillator tube, an oscillator tank circuit having one terminal thereof connected to ground, means for coupling said tank circuit to said local oscillator tube to produce a local oscillator signal across said tank circuit, a coupling capacitor connected between the grid of said local oscillator tube and the plate of said mixer tube, whereby said local oscillator signal is supplied to said signal grid of said mixer tube through said coupling capacitor and the plate to signal grid capacitance of said mixer tube, means for deriving an intermediate frequency signal from the plate circuit of said mixer tube, frequency discriminating means for developing from said intermediate frequency signal a control voltage which varies with changes in the frequency of the intermediate frequency carrier, and means for supplying said control voltage to said signal grid of said mixer tube, thereby to produce a variation in the plate resistance of said mixer tube in accordance with said control voltage, said variation in plate resistance of said mixer tube being reflected back to said local oscillator circuit through said coupling capacitor and producing a variable loading effect thereon which is effective to vary the frequency of said local oscillator signal.

7. In a supreheterodyne receiver, a mixer tube, means for supplying a signal modulated wave to the signal grid of said mixer tube, a local oscillator tube, means including a tank circuit connected to said oscillator tube for developing local oscillations, means including a coupling capacitor connected between said tank circuit and said signal grid of said mixer tube for supplying said local oscillations to said signal grid, means for deriving an intermediate frequency signal from the plate circuit of said mixer tube, frequency discriminating means for developing from said intermediate frequency signal a control voltage which varies in accordance with changes in the frequency of the intermediate frequency carrier, means for controlling the current flowing in said mixer tube in accordance with said control voltage, a source of energizing voltage for said oscillator tube, and means controlled in accordance with the current flowing in said mixer tube for varying said source of energizing voltage in such manner that the frequency of said local oscillations is varied in accordance therewith.

8. In a superheterodyne receiver, a mixer tube, means for supplying a signal modulated wave to the signal grid of said mixer tube, a local oscillator tube, means including a tank circuit connected to said oscillator tube for developing local oscillations, means including a coupling capacitor connected between said tank circuit and said signal grid of said mixer tube for supplying said local oscillations to said signal grid, means for deriving an intermediate frequency signal from the plate circuit of said mixer tube, frequency discriminating means for developing from said intermediate frequency signal a control voltage which varies in accordance with changes in the frequency of the intermediate frequency carrier, a source of energizing voltage for said oscillator tube, and means including said mixer tube for controlling said source of energizing voltage in accordance with variations in said control voltage so that the frequency of said local oscillations is varied in accordance therewith.

9. In a superheterodyne receiver, a mixer tube, means for supplying a signal modulated wave to the signal grid of said mixer tube, a local oscillator tube, means including a tank circuit connected to said oscillator tube for developing local oscillations, means including a coupling capacitor connected between said tank circuit and said signal grid of said mixer tube for supplying said local oscillations to said signal grid, means for deriving an intermediate frequency signal from the plate circuit of said mixer tube, frequency discriminating means for developing from said intermediate frequency signal a control voltage which varies in accordance with changes in the frequency of the intermediate frequency carrier, a source of energizing voltage, means connecting the plate circuits of both said mixer tube and said oscillator tube through a common impedance to said source of energizing voltage, means for impressing said control voltage on said signal grid of said mixer tube so that the current flowing in said common impedance varies in accordance with variations in said control voltage, and means for varying the frequency of said local oscillations in accordance with the current flowing in said common impedance.

References Cited in the file of this patent

UNITED STATES PATENTS 2,200,038 Mountjoy et al. ---------- May 7, 1940
2,783,373 Fowler ---------------- Feb. 26, 1957